United States Patent [19]
Hung et al.

[11] Patent Number: 6,072,358
[45] Date of Patent: *Jun. 6, 2000

[54] HIGH VOLTAGE PUMP CIRCUIT WITH REDUCED OXIDE STRESS

[75] Inventors: Chuan-Yung Hung, Cupertino; John Costello, San Jose; Stephanie Tran, San Jose; Guu Lin, San Jose; Mark Fiester, Los Gatos, all of Calif.

[73] Assignee: Altera Corporation, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/008,619

[22] Filed: Jan. 16, 1998

[51] Int. Cl.[7] .................................................. G06F 3/02
[52] U.S. Cl. .................................. 327/536; 327/537
[58] Field of Search .................................. 327/534, 536, 327/537; 307/110

[56] References Cited

U.S. PATENT DOCUMENTS

| | | | |
|---|---|---|---|
| 5,008,799 | 4/1991 | Montalvo | 363/60 |
| 5,126,590 | 6/1992 | Chern | 327/536 |
| 5,140,182 | 8/1992 | Ichimura | 327/536 |
| 5,266,842 | 11/1993 | Park | 327/534 |
| 5,436,586 | 7/1995 | Miyamoto | 327/530 |
| 5,448,198 | 9/1995 | Toyoshima et al. | 327/530 |
| 5,767,734 | 6/1998 | Vest et al. | 327/536 |
| 5,796,293 | 8/1998 | Yoon et al. | 327/536 |
| 5,831,470 | 11/1998 | Park et al. | 327/536 |

*Primary Examiner*—Terry D. Cunningham
*Attorney, Agent, or Firm*—Townsend and Townsend and Crew LLP

[57] ABSTRACT

Improved charge pump circuitry that significantly reduces voltage stress on transistor gate oxides is disclosed. The charge pump circuit according to a preferred embodiment of the present invention includes circuitry that biases the otherwise vulnerable transistors in the charge pump circuit such that the voltage across their gate oxide is reduced. The charge pump of the present invention further provides circuitry to reduce leakage current.

18 Claims, 3 Drawing Sheets

HIGH VOLTAGE PUMP CIRCUIT WITH REDUCED OXIDE STRESS

BACKGROUND OF THE INVENTION

The present invention relates in general to integrated circuits, and in particular to an improved voltage pump circuit that reduces stress on transistor gate oxide layer.

Charge pump techniques allow integrated circuits to internally generate voltage levels that are higher (or lower) than the externally supplied voltage source. One example of a circuit that requires voltages higher than the supply voltage is the electrically erasable programmable read only memory (EEPROM). EEPROM devices require programming voltage Vpp levels that are higher in value (e.g., 13 volts) than the normal power supply voltage level Vcc (e.g., 5 volts). In such devices, it is often necessary to boost the level at certain nodes inside the circuit to voltages even higher than Vpp. For example, to selectively transfer a full Vpp voltage level into a target cell via a pass transistor, the gate of the pass transistor requires a boosted voltage level even higher than Vpp. Therefore, Vpp is used in additional charge pump circuitry to generate boosted voltages (e.g., 15.5 v) on the word lines.

Under such conditions, transistors involved in the word line boost and driver circuitry experience much higher voltages than other transistors and are thus subject to higher stress. Over time, this stress leads to degradation of the thin oxide layer forming the gate dielectric in the MOS transistors.

FIG. 1 shows one example of a prior art word line driver circuit. In this circuit, when the enable signal EN is at a logic high level (e.g., at Vcc), the voltage on the word line WL is pumped to the smaller of [Vpp+(K*Vcc)-Vtnat] or Vpp+Vt (MN1), where the value of K can be adjusted by the designer, and Vtnat is the threshold voltage of the native device MNN2. When enable signal EN is at a logic low level (e.g., ground), the voltage on WL is also at the logic low level or ground. This causes the gate oxide for transistor MNN1 and MN1 to experience voltages as high as Vpp. With an exemplary oxide thickness value of 145 Angstroms, a Vpp of about 13 volts places transistor MNN1 and MN1 under excessive voltage stress when EN is at ground.

As the MOS transistor geometries continue to shrink with advances in semiconductor processing technology, oxide stress has become a much more serious reliability issue.

SUMMARY OF THE INVENTION

The present invention provides charge pump circuitry that significantly reduces voltage stress on transistor gate oxides. The charge pump circuit according to a preferred embodiment of the present invention includes circuitry that biases the otherwise vulnerable transistors in the charge pump circuit such that the voltage across their gate oxide is reduced. The charge pump of the present invention further provides circuitry to reduce leakage current.

In a specific embodiment the circuit includes an output transistor whose one source/drain terminal connects to a high voltage source, and whose gate terminal supplies the output of the charge pump circuit. When activated the voltage at the gate terminal of the output transistor is pumped to voltages higher than the high voltage source. When disabled, a bias circuit increases the voltage on the gate terminal from that of a conventional design to reduce the voltage experienced by the gate oxide of the output transistor.

Accordingly, in one embodiment, the present invention provides a charge pump circuit including an output transistor having a first source/drain terminal coupled to a source of high voltage, and a gate terminal; a pump circuit coupled to the gate terminal of the output transistor for pumping a voltage at the gate terminal to a voltage higher than the high voltage when activated; and a bias circuit coupled to the gate terminal of the output transistor for raising a voltage at the gate terminal of the output transistor to reduce oxide stress when the pump circuit is not activated. The charge pump circuit further includes a level shift circuit coupled to a second source/drain terminal of the output transistor to increase a voltage on the second source/drain terminal to cut off the output transistor when the pump circuit is not activated.

In a specific embodiment, the bias circuit includes two diode-connected transistors coupled in series between a power supply voltage and the gate terminal of the output transistor, and the level shift circuit includes one diode-connected transistor coupled between the power supply voltage and the second source/drain terminal of the output transistor.

A better understanding of the nature and advantages of the charge pump circuit of the present invention may be gained by referring to the detailed description and the drawings below.

DESCRIPTION OF THE PREFERRED EMBODIMENT

Figure 1:
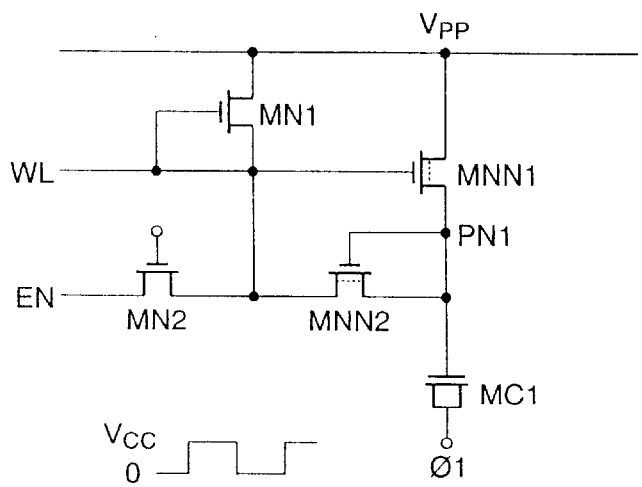
FIG. 1 is a circuit schematic of a typical prior art charge pump circuit.
Figure 2:
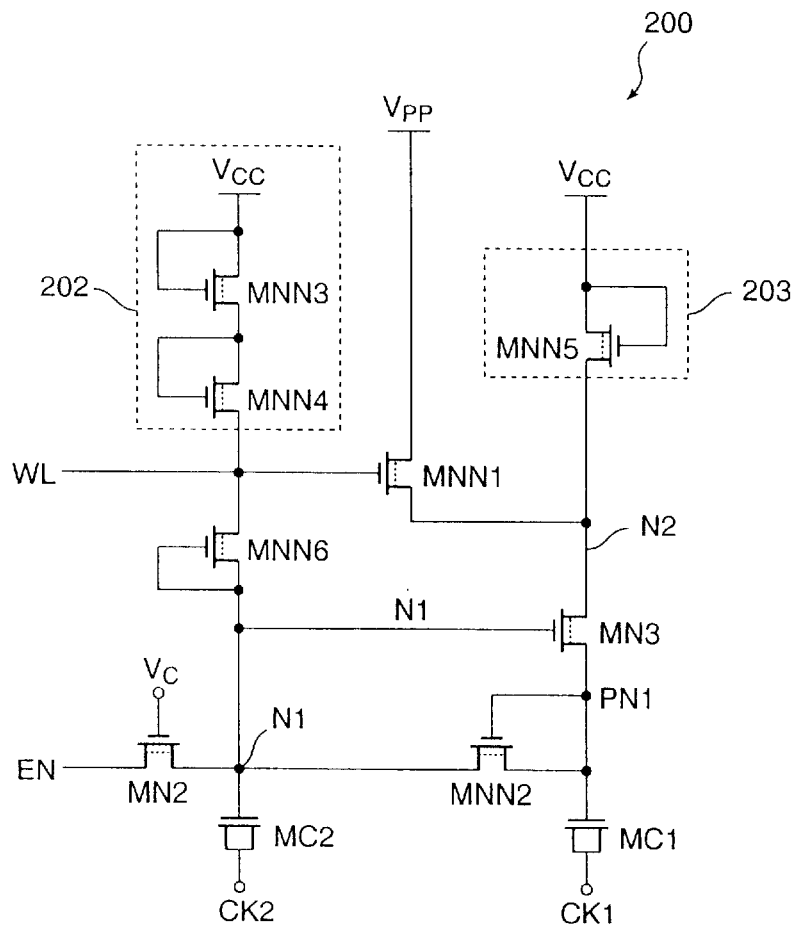
FIG. 2 is a circuit schematic of an improved charge pump circuit that reduces oxide stress according to the present invention.

One aspect of the invention is based on the realization that exposure of MOS transistors to a large voltage across the gate and drain terminal results in a degradation of the oxide layer resulting in device failure. Other features of the invention are concerned with reduction of the power consumption of the circuit. Referring to FIG. 2, there is shown a schematic for an improved charge pump circuit 200 that reduces voltage stress on transistor gate oxides and reduces power consumption. The charge pump circuit of the present invention may be used in any type of integrated circuit that requires high voltage switching, but is described herein in the context of a memory circuit for illustrative purposes only. The exemplary memory circuit requires the application of a voltage to memory array word lines that is higher in magnitude than a high programming voltage Vpp. Accordingly, the circuit of FIG. 2 includes a select (or enable) transistor MN2 that enables the charge pump circuit when it is selected to drive a word line. Transistor MN2 is preferably a native transistor and operates to transfer an enable signal EN to node N1. Node N1 connects to one plate of a charge pump capacitor MC2 whose other plate receives a clock signal CK2. Node N1 also connects to the word line WL via a diode-connected native transistor MNN6. Word line WL connects to the gate terminal of another native transistor MNN1 whose drain connects to Vpp. Vpp is a high-voltage programming signal that is typically generated by using charge pump techniques.

A bias circuit 202 connects between the power supply Vcc and word line WL. In the exemplary embodiment shown in FIG. 2, bias circuit 202 includes a couple of diode-connected native transistors MNN3 and MNN4 to meet oxide reliability requirements for a given process. Therefore, the specific bias circuit shown in FIG. 2 is for illustrative purposes only, and other implementations for bias circuit 202 (e.g., with processes having different requirements) will be known to those skilled in this art.

A level shift circuit 203, an exemplary implementation of which uses a diode-connected native transistor MNN5, connects between the source of transistor MNN1 (node N2) and the power supply Vcc. A native transistor MN3 connects node N2 to one plate of another charge pump capacitor MC1 at node PN1. The other plate of MC1 receives another clock signal CK1. The gate terminal of transistor MN3 connects to node N1, while node PN1 connects to node N1 via a native transistor MNN2 that is also diode-connected.

The operation of the charge pump circuit of the present invention will be described hereinafter. When charge pump 200 is selected, transistor MN2 passes signal EN that is at a logic high level (e.g., Vcc) to node N1, thus supplying the initial charge pump voltage. Clock signal CK2 pumps charge into node N1 via capacitor MC2 and clock signal CK1 pumps charge into node N1 via capacitor MC1 and transistor MNN2. The junction breakdown voltage of transistors MNN2 and MN3 limits the maximum voltage node PN1 can be pumped to. The pumped voltage at node N1 is transferred to the word line WL via transistor MNN6. Due to the charge pump action, the voltage at node N1 continues to increase until it reaches the junction breakdown voltage $V_{jbd}$ at node N1, or saturates based on Vcc and magnitude of threshold voltages. The voltage at WL follows node N1 with one Vtnat difference. Thus, if node N1 reaches as high as, for example, 17.6 volts ($V_{jbd}$ of transistor MNN2), the voltage at WL may be at about 16.2 volts.

A native transistor is one that does not receive a channel implant or may receive a lower implant during the fabrication process to adjust its threshold voltage. The threshold voltage Vtnat of a native NMOS transistor may be, for example, 0.3 volts, while the threshold voltage Vtn of an enhancement NMOS transistor may be, for example, about 1 volt. As is known to those skilled in this art, however, these threshold voltages vary with body effect. Thus, with the body of a native NMOS transistor biased at about, for example, 5 volts, Vtnat may be increased from, for example, 0.3 volts to about 1 volt.

Accordingly, when charge pump circuit 200 is active, the various circuit nodes are at high enough voltages to avoid a large voltage differential across the gate oxide of any given transistor. This condition thus does not give rise to oxide stress problems. It is when the charge pump circuit is not selected that there is potential for large voltage differential across certain transistors. The charge pump circuit of the present invention has been designed to reduce voltages applied to gate oxides of the various transistors that may otherwise have been vulnerable to high voltage stress.

When unselected, the signal EN is at ground, and thus node N1 is at ground. Instead of allowing the voltage on WL to drop down to ground as in the prior art, the circuit of the present invention isolates WL and biases it to a higher voltage. Specifically, with node N1 at ground, transistor MNN6 is turned off disconnecting the path between WL and node N1. Similarly, with its gate at ground, transistor MN3 is also turned off isolating node N2 from node PN1. With WL thus isolated from the pump circuit, bias circuit 202 operates to increase the voltage at WL. Two diode-connected native transistors MNN3 and MNN4 pull the voltage at WL up to (Vcc-2*Vtnat), which may be as high as, for example, about 3 volts. Thus, instead of having voltages as high as a full Vpp across the gate of transistor MNN1 in the inactive mode, the present invention reduces this voltage to well within the acceptable range.

The circuit of the present invention further adds transistor MNN5 to shift the voltage level at node N2 up to Vcc-Vtnat. By thus raising the potential at the source terminal of transistor MNN1 to a voltage higher (by one Vtnat) than that applied at the gate terminal of MNN1, the circuit ensures that transistor MNN1 remains in the cut off region, eliminating any leakage current path for Vpp.

While charge pump circuit 200 could work with only with the one charge pump capacitor MC1 (with CK1), in a preferred embodiment the circuit adds a second pump capacitor MC2 (with CK2) to ensure that the pump circuit operates properly at low power supply voltages. With only MC1 (and CK1), node PN1 would have to overcome three threshold voltages to keep pumping. It would therefore require a higher Vcc or lower transistor threshold voltages to keep operating. Adding MC2 and CK2 allows the pump to operates with lower Vcc or higher Vt's. Clock signals CK1 and CK2 are designed to be complementary and non-overlapping in phase.

Figure 3:
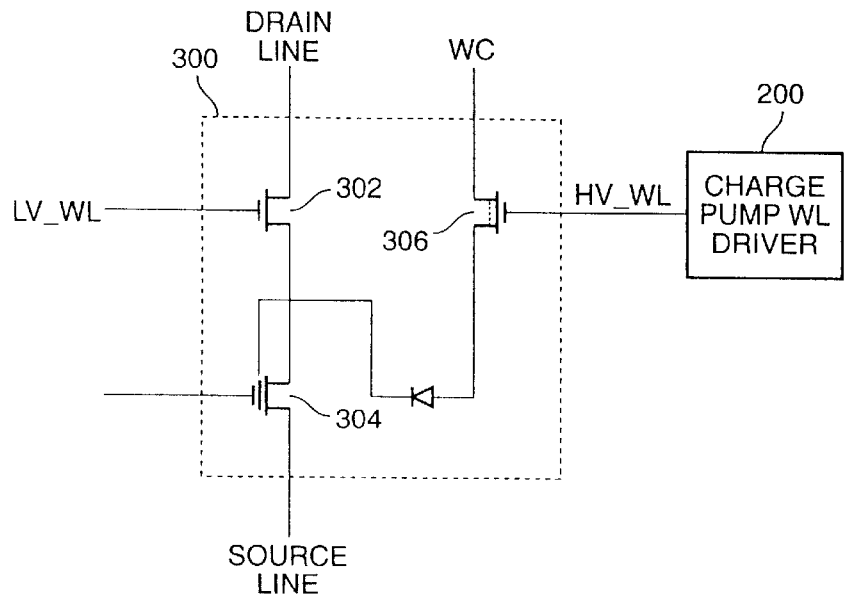
FIG. 3 is a circuit schematic for an exemplary EEPROM cell operating in conjunction with the charge pump circuit of the present invention.

A typical example of a memory circuit that could advantageously utilize the charge pump circuit of the present invention is electrically erasable programmable read only memory (EEPROM). FIG. 3 shows an example of an EEPROM memory cell 300 that includes a read transistor 302 connected to a floating gate transistor 304. A write column transistor 306 supplies the necessary programming voltage to floating gate transistor 304. The gate terminal of write column transistor 306 (HV_WL) is connected to the high voltage word line WL output of circuit 200 shown in FIG. 2. During normal operation, HV_WL is at Vcc, while during programming the voltage Vpp+Vtnat is applied to it when selected and Vcc-2Vtnat when not selected.

Figure 4:
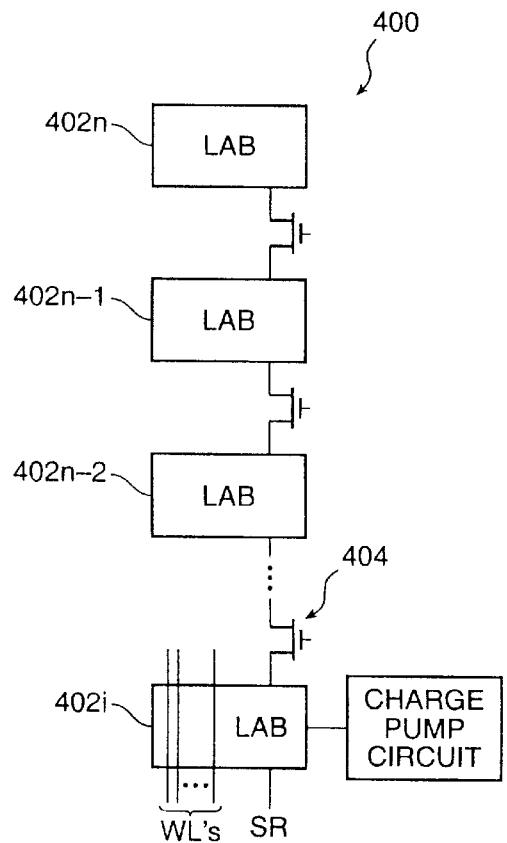
FIG. 4 shows an exemplary programmable logic device (PLD) using EEPROM cells and charge pump circuitry of the present invention.

One application of the EEPROM using the charge pump circuit of the present invention can be found in a programmable logic device (PLD). FIG. 4 shows an exemplary PLD 400 that includes large numbers of programmable logic elements grouped into several logic array blocks or LABs 402. Each LAB 402i includes an array of EEPROM cells that are used to configure the LAB. Charge pump circuit 200 supplies the high voltage signal for the gate terminal of the write column transistor in each EEPROM cell. Transistors 409 pass an output of a shift register from one LAB to another.

Figure 5:
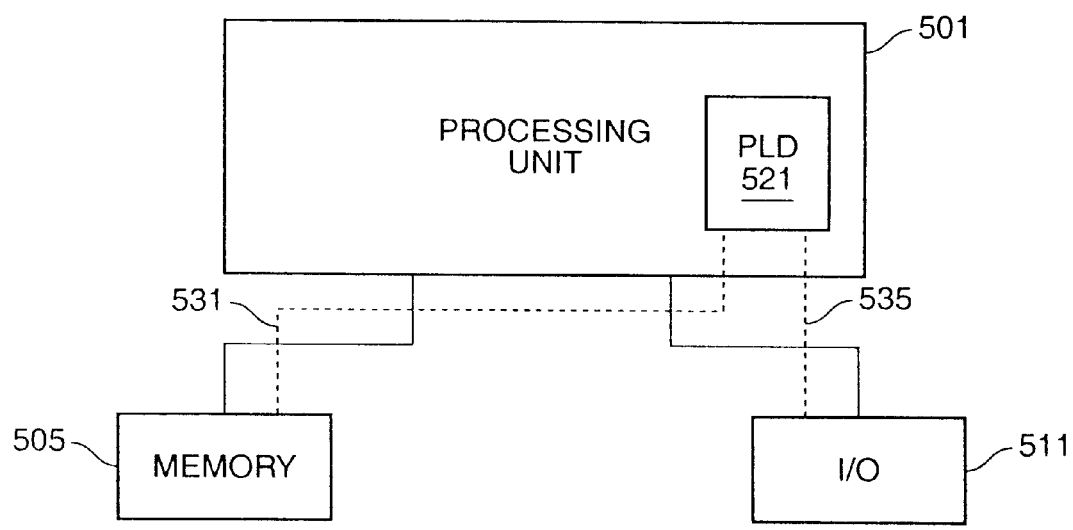
FIG. 5 shows a block diagram of an electronic system within which a PLD of the type shown in FIG. 4 may be advantageously employed.

FIG. 5 shows a block diagram of an electronic system within which a PLD of the type shown in FIG. 4 may be advantageously employed. In the particular embodiment of FIG. 5, a processing unit 501 is coupled to a memory 505 and an I/O 511, and incorporates a PLD 521. PLD 521 may be specially coupled to memory 505 through connection 531 and to I/O 511 through connection 535. The system may be a digital computing system such as a general or special purpose computer, or a specialized digital switching network, or other processing system.

Among the various functions performed by processing unit 501, it may direct data to an appropriate system component for processing or storage, execute a program stored in memory 505, or interface with other systems using I/O 511. Processing unit 501 may be a central processing unit (CPU), microprocessor, floating point coprocessor, graphics coprocessor, hardware controller, microcontroller, programmable logic device programmed for use as a controller, or other processing unit. In some embodiments, processing unit 501 may be a separate and independent computing system. Processing unit 501 may be used to configure and program PLD 521.

In other embodiments, source code may be stored in memory 505, compiled into machine language, and executed by processing unit 501. Processing unit 501 need not contain a CPU and in one embodiment, instructions may be executed by one or more PLDs 521. Instead of storing source code in memory 505, only the machine language representation of the source code may be stored in memory 505 for execution by processing unit 501. Memory 505 may store configuration data for programming PLD 521. Alternatively, memory 505 may be a random access memory (RAM), read only memory (ROM), fixed or flexible disk media, PC Card flash disk memory, tape, or any other storage retrieval means, or any combination of these storage retrieval means.

Processing unit 501 uses I/O 511 to provide an input and output path for user interface. For example, a user may input logical functions to be programmed into programmable logic device 521. I/O 511 may be a keyboard, mouse, track ball, digitizing tablet, text or graphical display, touch screen, pen tablet, printer, or other input or output means, or any combination of these means.

PLD 521 may serve many different purposes within the system in FIG. 5. PLD 521 may be a logical building block of processing unit 501, supporting its internal and external operations. PLD 521 is programmed to implement the logical functions necessary to perform a particular function within the system operation.

In conclusion, the present invention offers a charge pump circuit that significantly reduces voltage stress on transistor gate oxides. The charge pump circuit according to a preferred embodiment of the present invention includes circuitry that biases the otherwise vulnerable transistors in the charge pump circuit such that the voltage across their gate oxide is reduced. The charge pump of the present invention further provides circuitry to reduce leakage current. While the above is a complete description of the preferred embodiment of the present invention, it is possible to use various alternatives, modifications and equivalents. For example, the use of the charge pump circuit of the present invention in not limited to EPROM, which has been used herein for illustrative purposes only. Other memory devices such as EPROM, Flash, memory circuits based on fusible links, or any other circuit where high voltage switching is required can advantageously use the teachings of the present invention. Therefore, the scope of the present invention should be determined not with reference to the above description but should, instead, be determined with reference to the appended claims, along with their full scope of equivalents.

What is claimed is:

1. A charge pump circuit comprising:
 a pass transistor having a first source/drain terminal coupled to a source of high voltage, a second source/drain terminal and a gate terminal;
 an enable transistor having a first source/drain terminal coupled to receive an enable input, a gate terminal coupled to a control signal, and a second source/drain terminal coupled to an enable node;
 a first pump capacitor having a first terminal coupled to a pump node and a second terminal coupled to receive a pump input;
 a pump transistor coupled between the pump node and the enable node and configured to pump a voltage at the gate terminal of the pass transistor to a voltage larger than the high voltage when activated in response to an enable signal on the enable input;
 a first isolation transistor coupled between the enable node and the gate terminal of the pass transistor, and configured to isolate the gate terminal of the pass transistor from the enable node when the charge pump circuit is not enabled;
 a second isolation transistor coupled between the second source/drain terminal of the pass transistor and the pump node, and configured to isolate the second source/drain terminal of the pass transistor from the pump node when the charge pump circuit is not enabled; and
 a bias circuit coupled to the gate terminal of the pass transistor and configured to raise a voltage at the gate terminal of the pass transistor to reduce oxide stress when the pump circuit is disabled in response to the enable signal.

2. The charge pump circuit of claim 1 further comprising a level shift circuit coupled to the second source/drain terminal of the pass transistor to increase a voltage on said second source/drain terminal of said pass transistor to cut off the pass transistor when the pump circuit is disabled.

3. The charge pump circuit of claim 2 wherein said bias circuit comprises first and second diode-connected transistors coupled in series between a power supply voltage and the gate terminal of the pass transistor.

4. The charge pump circuit of claim 3 wherein said level shift circuit comprises a diode-connected transistor coupled between said power supply voltage and the second source/drain terminal of the pass transistor.

5. The charge pump circuit of claim 4 wherein said first pump input comprises a first clock signal.

6. The charge pump circuit of claim 5 wherein said pump circuit further comprises:
 a second capacitor having a first terminal coupled to receive a second clock signal, and a second terminal coupled to said enable node.

7. The charge pump circuit of claim 6 wherein all transistors are native n-channel MOS transistors.

8. The charge pump circuit of claim 6 wherein said first and second clock signals have complementary and non-overlapping phases.

9. The charge pump circuit of claim 1 wherein said source of high voltage is an output of a second charge pump circuit, wherein said second charge pump circuit is configured to generate a voltage larger than a power supply voltage.

10. A circuit comprising:
 an array of memory cells including a plurality of word lines coupled to a respective plurality of memory cells; and
 a word line driver coupled to a word line in said array of memory cells, wherein the word line driver comprises:
  a pass transistor having a first source/drain terminal coupled to a high voltage node and a gate terminal coupled to a memory word line;
  a pumping subcircuit coupled to a second source/drain terminal and the gate terminal of the pass transistor, said pumping subcircuit comprising a capacitor coupled to a pump transistor;

an enable transistor coupled to said pumping subcircuit at a first node and configured to receive a charge pump enable signal;

a first isolation transistor coupled between the gate terminal of the pass transistor and the first node, said first isolation transistor operating to isolate the gate terminal of the pass transistor from the pumping subcircuit when the charge pump is not enabled;

a second isolation transistor coupled between the second source/drain terminal of the pass transistor and the pumping subcircuit, said second isolation transistor operating to isolate the second source/drain terminal of the pass transistor from the pumping subcircuit when the charge pump is not enabled; and a bias circuit coupled between the gate terminal of the pass transistor and a positive supply voltage, wherein, the bias circuit brings a voltage on the gate terminal of the pass transistor closer to a voltage on the high voltage node when the charge pump enable signal disables the charge pump circuit.

11. The circuit of claim 10 wherein said word line driver further comprises a level shift transistor having a first source/drain terminal coupled to the second source/drain terminal of the pass transistor, and gate and second source/drain terminals coupled to the positive supply voltage.

12. The circuit of claim 10 wherein said array of memory cells is of read only memory (ROM) type comprising a plurality of ROM cells each having a word line.

13. The circuit of claim 12 further comprising a plurality of programmable logic elements coupled to said array of memory cells wherein the circuit forms a programmable logic device.

14. The circuit of claim 13 wherein the programmable logic device operates within an electronic system comprising:

a processing unit including the programmable logic device;

a memory unit storing data;

an interface; and a bus network providing communication links between said processing unit, memory unit and interface.

15. A charge pump circuit comprising:

a pass transistor having a first source/drain terminal coupled to a source of high voltage, a second source/drain terminal and a gate terminal;

a pumping subcircuit coupled to the second source/drain terminal of the pass transistor, the pumping subcircuit having a pump capacitor, a pump transistor, and an enable transistor, the enable transistor being configured to enable charge pumping action by the pumping subcircuit in response to an enable signal;

a first isolation transistor diode-coupled between the pumping subcircuit and the gate terminal of the pass transistor;

a second isolation transistor coupled between the pumping subcircuit and the second source/drain terminal of the pass transistor; and a bias circuit coupled to the gate terminal of the pass transistor and configured to raise a voltage at the gate terminal of the pass transistor to reduce oxide stress when the charge pumping action of the circuit is disabled in response to the enable signal.

16. The circuit of claim 15 further comprising a level shift transistor coupled between the second source/drain terminal of the pass transistor and a power supply voltage.

17. A charge pump circuit comprising:

a pass transistor having a first source/drain terminal coupled to a source of high voltage, a second source/drain terminal and a gate terminal;

a first pump capacitor coupled to the second source/drain terminal of the pass transistor via a first transistor;

a second pump capacitor coupled to the gate terminal of the pass transistor via a diode-coupled isolation transistor, the second pump capacitor and the isolation transistor coupling to a gate terminal of the first transistor;

an enable transistor coupled between an enable input terminal and the second pump capacitor, and having a gate terminal coupled to a control voltage;

a pump transistor diode-coupled between the first pump capacitor and the second pump capacitor; and a bias circuit coupled between the gate terminal of the pass transistor and a positive supply voltage.

18. The charge pump circuit of claim 17 further comprising a level shift transistor having a first source/drain terminal coupled to the second source/drain terminal of the pass transistor, and a gate terminal and a second source/drain terminal coupled to the positive supply voltage.

* * * * *